(12) United States Patent
Becken et al.

(10) Patent No.: US 7,537,504 B2
(45) Date of Patent: May 26, 2009

(54) METHOD OF ENCAPSULATING A DISPLAY ELEMENT WITH FRIT WALL AND LASER BEAM

(75) Inventors: Keith James Becken, Bath, NY (US); Stephan Lvovich Logunov, Corning, NY (US)

(73) Assignee: Corning Incorporated, Corning, NY (US)

( * ) Notice: Subject to any disclaimer, the term of this patent is extended or adjusted under 35 U.S.C. 154(b) by 123 days.

(21) Appl. No.: 11/599,738

(22) Filed: Nov. 15, 2006

(65) Prior Publication Data

US 2007/0128967 A1 Jun. 7, 2007

Related U.S. Application Data

(60) Provisional application No. 60/748,297, filed on Dec. 6, 2005.

(51) Int. Cl.
*H01J 9/24* (2006.01)
*H01J 9/26* (2006.01)

(52) U.S. Cl. .......................................... 445/25; 445/24
(58) Field of Classification Search .............. 445/24–25
See application file for complete search history.

(56) References Cited

U.S. PATENT DOCUMENTS

| | | | |
|---|---|---|---|
| 3,414,465 A | 12/1968 | Baak et al. | |
| 3,778,126 A | 12/1973 | Wilson | 316/20 |
| 3,995,941 A | 12/1976 | Nagahara et al. | 350/160 |
| 4,400,870 A | 8/1983 | Islam | 29/588 |
| 5,489,321 A | 2/1996 | Tracy et al. | 65/43 |
| 5,682,453 A | 10/1997 | Daniel et al. | 385/99 |
| 5,693,111 A | 12/1997 | Kadowaki et al. | 65/43 |
| 5,821,692 A | 10/1998 | Rogers et al. | 313/512 |
| 5,872,355 A | 2/1999 | Hueschen | 250/208.1 |
| 5,874,804 A | 2/1999 | Rogers | 313/512 |
| 5,998,805 A | 12/1999 | Shi et al. | 257/40 |
| 6,069,443 A | 5/2000 | Jones et al. | 313/504 |
| 6,109,994 A * | 8/2000 | Cho et al. | 445/25 |
| 6,129,603 A | 10/2000 | Sun et al. | 445/25 |
| 6,137,221 A | 10/2000 | Roitman et al. | 313/504 |
| 6,146,225 A | 11/2000 | Sheats et al. | 445/24 |
| 6,226,890 B1 | 5/2001 | Boroson et al. | 34/472 |
| 6,268,695 B1 | 7/2001 | Affinito | 313/504 |
| 6,356,376 B1 | 3/2002 | Tonar et al. | 359/267 |
| 6,370,019 B1 | 4/2002 | Matthies et al. | 361/681 |

(Continued)

FOREIGN PATENT DOCUMENTS

JP 58-211743 9/1983

(Continued)

*Primary Examiner*—Nimeshkumar D. Patel
*Assistant Examiner*—Anne M Hines
(74) *Attorney, Agent, or Firm*—Kevin M. Able

(57) ABSTRACT

A method of minimizing stress in an OLED device laser sealing process using an elongated laser beam. A laser beam having an intensity distribution which decreases as a function of distance from the longitudinal axis of the beam is passed through a mask to create an elongated beam having a lengthwise intensity distribution which decreases as a function of distance from the axis of the beam and a substantially constant width-wise intensity distribution. The elongated beam is traversed over a line of frit disposed between two substrates. The tails of the length-wise intensity distribution provide for a slow cool down of the frit as the beam traverses the line of frit.

13 Claims, 5 Drawing Sheets

U.S. PATENT DOCUMENTS

| | | | |
|---|---|---|---|
| 6,465,953 B1 | 10/2002 | Duggal | 313/553 |
| 6,470,594 B1 | 10/2002 | Boroson et al. | 34/335 |
| 6,501,044 B1 | 12/2002 | Klockhaus et al. | 219/121.64 |
| 6,565,400 B1 * | 5/2003 | Lee et al. | 445/25 |
| 6,733,850 B1 | 5/2004 | Domi et al. | 428/34 |
| 6,998,776 B2 | 2/2006 | Aitken et al. | 313/512 |
| 7,235,781 B2 * | 6/2007 | Haase et al. | 250/288 |
| 2001/0048234 A1 | 12/2001 | Liu et al. | 297/3 |
| 2002/0125822 A1 | 9/2002 | Graff et al. | 313/506 |
| 2002/0149312 A1 | 10/2002 | Roberts et al. | 313/495 |
| 2003/0066311 A1 | 4/2003 | Li et al. | 65/43 |
| 2004/0069017 A1 | 4/2004 | Li et al. | 65/43 |
| 2004/0207314 A1 | 10/2004 | Aitken et al. | 313/504 |
| 2005/0001545 A1 | 1/2005 | Aitken et al. | 313/512 |
| 2005/0151151 A1 | 7/2005 | Hawtof et al. | 571/100 |
| 2006/0009109 A1 | 1/2006 | Aitken et al. | 445/24 |
| 2007/0090759 A1 | 4/2007 | Choi et al. | 313/512 |
| 2007/0096631 A1 | 5/2007 | Sung et al. | 313/498 |
| 2007/0114909 A1 | 5/2007 | Park et al. | 313/495 |
| 2007/0170324 A1 | 7/2007 | Lee et al. | 248/247 |
| 2007/0170423 A1 | 7/2007 | Choi et al. | 257/40 |
| 2007/0170455 A1 | 7/2007 | Choi et al. | 257/100 |
| 2007/0170605 A1 | 7/2007 | Lee et al. | 264/1.1 |
| 2007/0170839 A1 | 7/2007 | Choi et al. | 313/500 |
| 2007/0170845 A1 | 7/2007 | Choi et al. | 313/504 |
| 2007/0170846 A1 | 7/2007 | Choi et al. | 313/504 |
| 2007/0170849 A1 | 7/2007 | Park | 313/506 |
| 2007/0170850 A1 | 7/2007 | Choi et al. | 313/506 |
| 2007/0170854 A1 | 7/2007 | Kwak | 313/512 |
| 2007/0170855 A1 | 7/2007 | Choi et al. | 313/512 |
| 2007/0170856 A1 | 7/2007 | Cha | 313/512 |
| 2007/0170859 A1 | 7/2007 | Choi et al. | 313/512 |
| 2007/0170860 A1 | 7/2007 | Choi et al. | 313/512 |
| 2007/0170861 A1 | 7/2007 | Lee et al. | 313/512 |
| 2007/0171637 A1 | 7/2007 | Choi | 362/227 |
| 2007/0173167 A1 | 7/2007 | Choi | 362/227 |

FOREIGN PATENT DOCUMENTS

| | | |
|---|---|---|
| JP | 10-074583 | 3/1998 |
| JP | 2003-187962 | 4/2003 |
| WO | WO93/12049 | 6/1993 |
| WO | WO01/44865 | 6/2001 |
| WO | WO02/05361 | 1/2002 |
| WO | WO02/21557 | 3/2002 |
| WO | WO03/005774 | 1/2003 |

* cited by examiner

METHOD OF ENCAPSULATING A DISPLAY ELEMENT WITH FRIT WALL AND LASER BEAM

This application claims the benefit of priority under 35 U.S.C. § 119(e) of U.S. Provisional Application Ser. No. 60/748,297 filed on Dec. 6, 2005, the content of which is incorporated herein in its entirety by reference.

BACKGROUND OF THE INVENTION

1. Field of the Invention

This invention is directed to a method for encapsulating a display element such as are used for glass substrates for flat panel display devices.

2. Technical Background

Organic light emitting diodes (OLEDs) have been the subject of considerable research in recent years because of their use and potential use in a wide variety of electroluminescent devices. For instance, a single OLED can be used in a discrete light emitting device or an array of OLEDs can be used in lighting or flat-panel display applications (e.g., OLED displays). OLED flat panel displays in particular are known to be very bright and to have good color contrast and wide viewing angle. It is well known that the life of the OLED display can be significantly increased if the electrodes and organic layers located therein are hermetically sealed from the ambient environment. However, OLED displays, and in particular the electrodes and organic layers located therein, are susceptible to degradation resulting from interaction with oxygen and moisture leaking into the OLED display from the ambient environment. Unfortunately, in the past it has been very difficult to develop a sealing process to hermetically seal the OLED display. Some of the factors that made it difficult to properly seal the OLED display are briefly mentioned below:

- The hermetic seal should provide a barrier for oxygen ($10^{-3}$ cc/m$^2$/day) and water ($10^{-6}$ g/m$^2$/day).
- The size of the hermetic seal should be minimal (e.g., <2 mm) so it does not have an adverse effect on size of the OLED display.
- The temperature generated during the sealing process should not damage the materials (e.g., electrodes and organic layers) within the OLED display. For instance, the first pixels of OLEDs which are located about 1-2 mm from the seal in the OLED display should not be heated to more than 100° C. during the sealing process.
- The gases released during sealing process should not contaminate the materials within the OLED display.
- The hermetic seal should enable electrical connections (e.g., thin-film chromium electrodes) to enter the OLED display.

One way to seal the OLED display is to form a hermetic seal by melting a low temperature frit doped with a material that is highly absorbent at a specific wavelength of light. For example, a high power laser may be used to heat and soften the frit which forms a hermetic seal between a cover glass with the frit located thereon and a substrate glass with OLEDs located thereon. The frit is typically about 0.5 mm to 1 mm wide and approximately 6-100 um thick. If the absorption and thickness of the frit is uniform then sealing can be done at a constant laser energy and translation speed so as to provide a uniform temperature rise at the frit location. Nevertheless, without adequate cooling of the heated frit (and substrates), cracking of the frit and/or substrates can occur due to thermal stresses generated during the sealing process. What is needed is a method of heating the frit which provides sufficient heating of the frit to melting the frit and seal the substrates, while also providing appropriate cooling of the frit, without undue heating and damage to the display element.

SUMMARY

In one embodiment according to the present invention, a method is disclosed comprising providing a first substrate and a second substrate separated by at least one frit wall, and at least one display element disposed between the first and second substrates, impinging a laser beam on the at least one frit wall through the first substrate and traversing the beam along a length of the wall to heat the frit and seal the first substrate to the second substrate. An intensity distribution of the impinging beam in a direction of travel of the beam is decreases as a function of distance from a longitudinal axis of the beam, and an intensity distribution of the impinging beam in a direction orthogonal to the direction of travel varies by no more than about 10% from a peak intensity of the beam. The at least one frit wall preferably comprises a frame shape. Moreover, a plurality of display elements may be disposed between the first and second substrates. The beam preferably passes through a mask comprising a transparent region shaped as a slit. The mask may include an absorbing surface or a reflective surface. The beam is preferably traversed over the frit at a speed greater than about 10 mm/s. The traversing may be accomplished by reflecting the beam from at least one galvanic mirror.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods features and advantages be included within this description, be within the scope of the present invention, and be protected by the accompanying claims.

DETAILED DESCRIPTION

Figure 1:
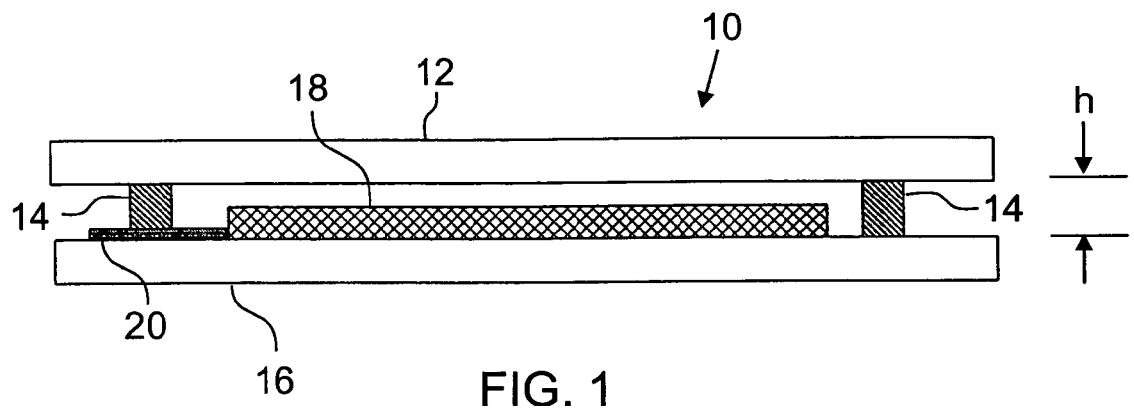
FIG. 1 is a cross sectional side view of a display device according to an embodiment of the present invention.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

Although the sealing techniques of the present invention are described below with respect to manufacturing a hermetically sealed OLED display, it should be understood that the same or similar sealing techniques can be used to seal two glass plates to one another that can be used in a wide variety of applications and device. Accordingly, the sealing techniques of the present invention should not be construed in a limited manner.

Referring to FIG. 1, a cross-sectional side view of a hermetically sealed organic light emitting diode (OLED) display device in accordance with an embodiment of the present invention is shown, generally designated by reference numeral 10 comprising first substrate 12, frit 14, second substrate 16, at least one OLED element 18 and at least one electrode 20 in electrical contact with the OLED element. Typically, OLED element 18 is in electrical contact with an anode electrode and a cathode electrode. As used herein, electrode 20 in FIG. 1 represents either electrode. Although only a single OLED element is shown for simplicity, display device 10 may have many OLED elements disposed therein. The typical OLED element 18 includes one or more organic layers (not shown) and anode/cathode electrodes. However, it should be readily appreciated by those skilled in the art that any known OLED element 18 or future OLED element 18 can be used in display device 10. In addition, it should be appreciated that another type of thin film device can be deposited besides OLED element 18. For example, thin film sensors may be fabricated using the present invention.

In a preferred embodiment, first substrate 12 is a transparent glass plate like the ones manufactured and sold by Corning Incorporated under the brand names of Code 1737 glass or Eagle 2000™ glass. Alternatively, first substrate 12 can be any transparent glass plate such as, for example, the ones manufactured and sold by Asahi Glass Co. (e.g., OA10 glass and OA21 glass), Nippon Electric Glass Co., NHTechno and Samsung Corning Precision Glass Co. Second substrate 16 may be the same glass substrate as first substrate 12, or second substrate 16 may be a non-transparent substrate.

Figure 2:
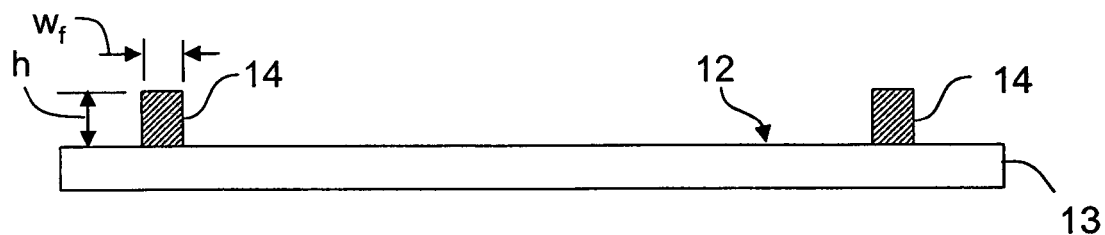
FIG. 2 is a cross sectional side view of the first substrate and the frit deposited thereon in accordance with an embodiment of the present invention.
Figure 3:
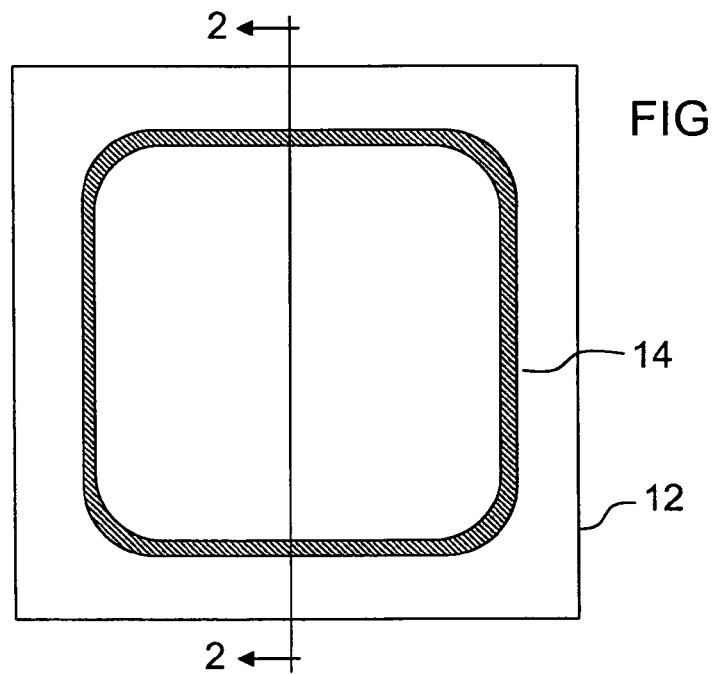
FIG. 3 is a top view of the first substrate of FIG. 2 showing the frit deposited in the shape of a frame.

As shown in FIGS. 2-3, prior to sealing first substrate 12 to second substrate 16, frit 14 is deposited on first substrate 12, typically as a line of a frit paste comprising a glass powder, a binder (usually organic) and/or a liquid vehicle. Frit 14 can be applied to first substrate 12 by screen-printing or by a programmable auger robot which provides a well-shaped pattern on first substrate 12. For example, frit 14 can be placed approximately 1 mm away from the free edges 13 of first substrate 12 as a line, or a plurality of connected lines, and is typically deposited in the shape of a closed frame or wall. In a preferred embodiment, frit 14 is a low temperature glass frit that has a substantial optical absorption cross-section at a predetermined wavelength which matches or substantially matches the operating wavelength of a laser used in the sealing process. Frit 14 may, for example, contain one or more light absorbing ions chosen from the group including iron, copper, vanadium, neodymium and combinations thereof (for example). Frit 14 may also include a filler (e.g., an inversion filler or an additive filler) which changes the coefficient of thermal expansion of frit 14 so that it matches or substantially matches the coefficient of thermal expansions of substrates 12 and 16. For a more detailed description regarding exemplary frit compositions that may be used in this application, reference is made to U.S. Pat. No. 6,998,776 entitled "Glass Package that is Hermetically Sealed with a Frit and Method of Fabrication", the contents of which are incorporated by reference herein.

Frit 14 may also be pre-sintered prior to sealing first substrate 12 to second substrate 16. To accomplish this, frit 14, which was deposited onto first substrate 12, is heated so that it becomes attached to first substrate 12. Then, first substrate 12 with the frit pattern located thereon can then be placed in a furnace which "fires" or consolidates frit 14 at a temperature that depends on the composition of the frit. During the pre-sintering phase, frit 14 is heated and organic binder materials contained within the frit are burned out.

After frit 14 is pre-sintered, it can be ground, if necessary, so that the height variation along the frit line does not exceed about 2-4 μm, with a typical target height h which can be 10 μm to greater than 30 μm, depending on the application for device 10; however, more typically height h is about 12-15 μm. If the height variation is larger, a gap which may be formed between the frit and substrate 16 when substrates 12 and 16 are joined may not close when frit 14 melts during laser sealing to a second substrate, or the gap may introduce stresses which can crack the substrates, particularly during cooling of the frit and/or substrates. An adequate but not overly thick frit height h allows the substrates to be sealed from the backside of first substrate 12. If frit 14 is too thin it does not leave enough material to absorb the laser radiation, resulting in failure. If frit 14 is too thick it will be able to absorb enough energy at the first surface to melt, but will prevent the necessary energy needed to melt the frit from reaching the region of the frit proximate secondary substrate 16. This usually results in poor or spotty bonding of the two glass substrates.

If the pre-sintered frit 14 is ground, first substrate 12 may go through a mild ultrasonic cleaning environment to remove any debris that has accumulated to this point. The typical solutions used here can be considerably milder than the ones used for cleaning display glass which has no additional deposition. During cleaning, the temperature can be kept low to avoid degradation of deposited frit 14.

After cleaning, a final processing step can be performed to remove residual moisture. The pre-sintered first substrate 12 can be placed in a vacuum oven at a temperature of 100° C. for 6 or more hours. After removal from the oven, the pre-sintered first substrate 12 can be placed in a clean room box to deter dust and debris from accumulating on it before performing the sealing process.

Figure 4:
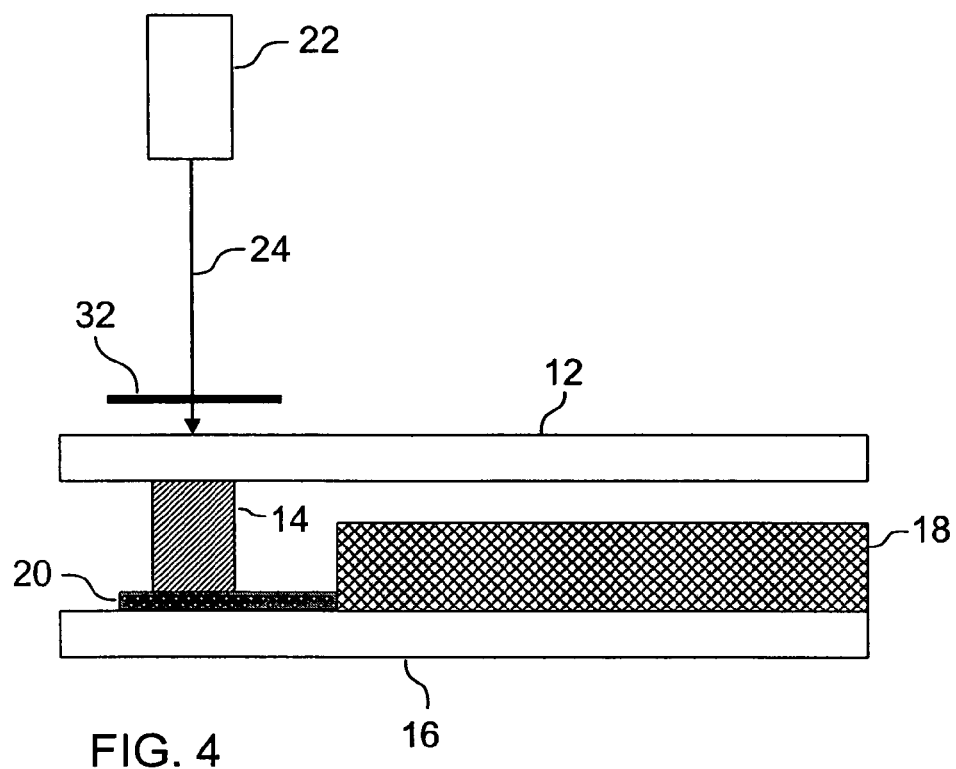
FIG. 4 is a partial side cross sectional view of a display device in accordance with an embodiment of the present invention including a display element and electrodes deposited thereon, and showing the position of the laser and laser beam during the sealing operation.

The sealing process includes placing first substrate 12, with frit 14, on top of second substrate 16, with one or more OLEDs 18 and one or more electrodes 20 deposited on the second substrate 16, in such a manner that frit 14, the one or more OLEDs 18, and electrodes 20 are sandwiched between the two substrates 12 and 16 separated by frit 14. Mild pressure can be applied to substrates 12 and 16 to keep them in contact during the sealing process. As shown in FIG. 4, laser 22 directs laser beam 24 onto frit 14 through first substrate 12 and heats frit 14 such that frit 14 melts and forms a hermetic seal which connects and bonds substrate 12 to substrate 16. The hermetic seal also protects OLEDs 18 by preventing oxygen and moisture in the ambient environment from entering into OLED display 10.

Laser beam 24 can be defocused, for example, to make the temperature gradient within frit 14 more gradual. It should be noted that if the gradient is too steep (focus is too tight), OLED display 10 may exhibit cracking and subsequent failure. Frit 14 generally needs a warm up and cool down phase before melting. In addition, the pre-sintered first substrate should be stored in an inert atmosphere to prevent re-adsorption of $O_2$ and $H_2O$ before melting. The speed of travel of the laser 22 (or beam 24) to the frit pattern can range from between about 0.5 mm/s to as much as 300 mm/s, although a speed of between 30 mm/s and 40 mm/s is more typical. The power necessary from the laser beam may vary depending on the optical absorption coefficient $\alpha$ and thickness h of frit 14. The necessary power is also affected if a reflective or absorbent layer is placed beneath frit 14 (between frit 14 and substrate 16) such as materials used to fabricate electrode(s) 20, and by the speed of traverse of laser beam 24 over the frit. Additionally, the composition, homogeneity and filler particle size of the frit 14 can vary. This, too, can adversely affect the way the frit absorbs the optical energy of impinging laser beam 24. As laser beam 24 is traversed over frit 14, frit 14 melts to seal substrates 12 and 16 one to the other. The gap between substrate 12 and 16 caused by the frit seal forms a hermetic pocket or envelope for OLED element 18 between the substrates. It should be noted that if second substrate 16 is transparent at the sealing wavelength, sealing may be performed through second substrate 16, or both substrates 12 and 16.

Cooling of display device 10 should be undertaken such that excess stress is not experienced by device 10 (e.g. substrates 12 and 16) during the cooling down of the just-sealed substrates and frit. Unless properly cooled, these stresses may result in a weak bond between the substrates, and impact the hermeticity of the bond. The laser beam which impinges on the frit through one of the substrates preferably has a substantially circular beam shape in a radial cross section. The beam therefore impinges on the frit as a generally circular spot, and the intensity distribution across a diameter of the beam is preferably decreasing as a function of distance from the axis of the beam, having a peak intensity at or near the center axis of the beam. For example, the beam may be substantially Gaussian. The diameter $2\omega$ of the spot in a conventional sealing method (where $\omega$ is that distance from the beam axis for which the intensity of the beam is $1/e^2$ the maximum beam intensity) is chosen to be generally about equal to or less than the width of the frit—on the order of between about 0.5 and 1 mm. However, for fast sealing speeds, e.g. greater than about 10 mm/s, a laser spot diameter of less than about 1 mm may result in rapid cooling of the frit/substrate as the spot leaves a particular point on the frit, when what is desired is a relatively slow cool down which can result in an anneal of the frit/substrate. As a general rule, a faster sealing speed is desirable. First, process throughput is increased. Second, the acceptable variation in laser power is greater at a faster sealing speed. On the other hand, as described supra, an increase in the diameter of the spot to mitigate rapid cooling may lead to a heating of the adjacent OLED element sandwiched between the substrates. To overcome this drawback and in accordance with the present embodiment, employing a laser beam having an increased spot diameter (larger than the width of the frit), and masking a portion of the enlarged spot size to prevent heating a portion of device 10 other than the frit (e.g. OLED element 18) may be used.

Figure 5:
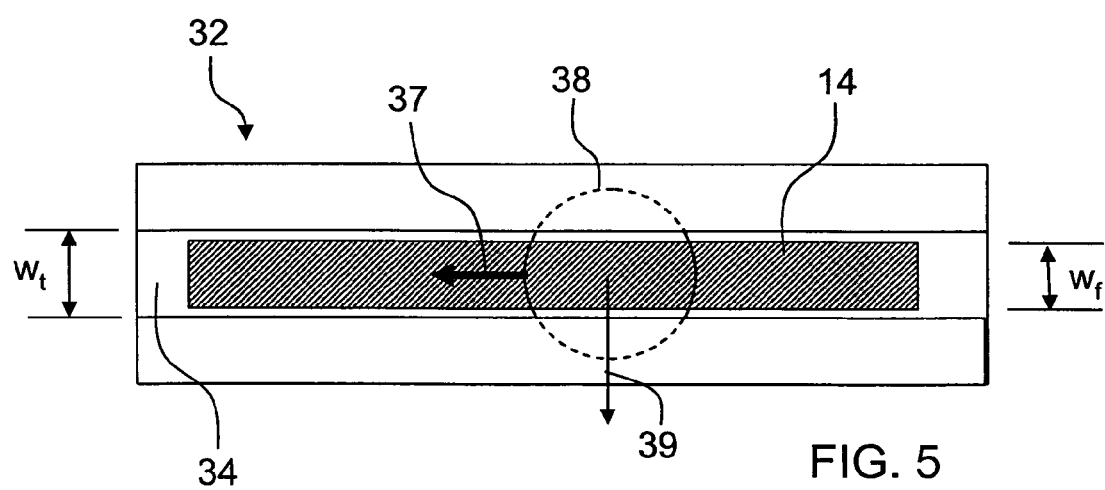
FIG. 5 is a partial top view of the mask of FIG. 4 and a portion of the frit

In accordance with the embodiment, a spot diameter greater than about 2 times the width of the frit line between first and second substrates 12, 16 is proposed. Preferably, the intensity distribution across a diameter of the spot is decreasing as a function of distance from a center axis of the beam. For example, the beam may have a substantially Gaussian intensity profile, but may have other shapes, such as triangular. A mask 32 shown in FIG. 4 is positioned over the first substrate; more particularly, mask 32 is positioned such that a transparent or open portion of the mask is positioned above the line of frit disposed between the substrates. FIG. 5 shows a close-up view of a portion of mask 32 comprising a transmission region 34 having a width $w_t$ approximately equal to or, depending on the distance between the mask and first substrate 12, wider than the width of the frit line, $w_f$, and an opaque region 36. Laser beam 24 is then traced along the transmission region in a longitudinal direction indicated by arrow 37 and hence over the frit line, heating the frit and sealing the substrates with a hermetic seal. Beam spot 38 is blocked in a width-wise direction (indicated by the dashed-line portion of spot 38, and arrow 39) on either side of frit 14 by opaque region 36, while simultaneously being unobstructed in the longitudinal direction (i.e. along a length of the frit) through transmission region 34. Because the beam (and the spot) preferably has a circularly symmetric intensity distribution, and the intensity distribution in the longitudinal direction is unobstructed, the tail-off of the intensity along a length of the frit (due to the decreasing intensity distribution) provides for a relatively slow cool down of the frit. On the other hand, the portion of the beam which passes through transparent region 34 and impinges on the frit preferably has a substantially constant (flat) intensity, varying across the width of the frit (i.e. orthogonal to the direction of travel of the beam as it traverses the frit) no more than about 10% from a peak value at the center axis of the beam, thus providing for relatively even heating of frit 14.

Figure 6:
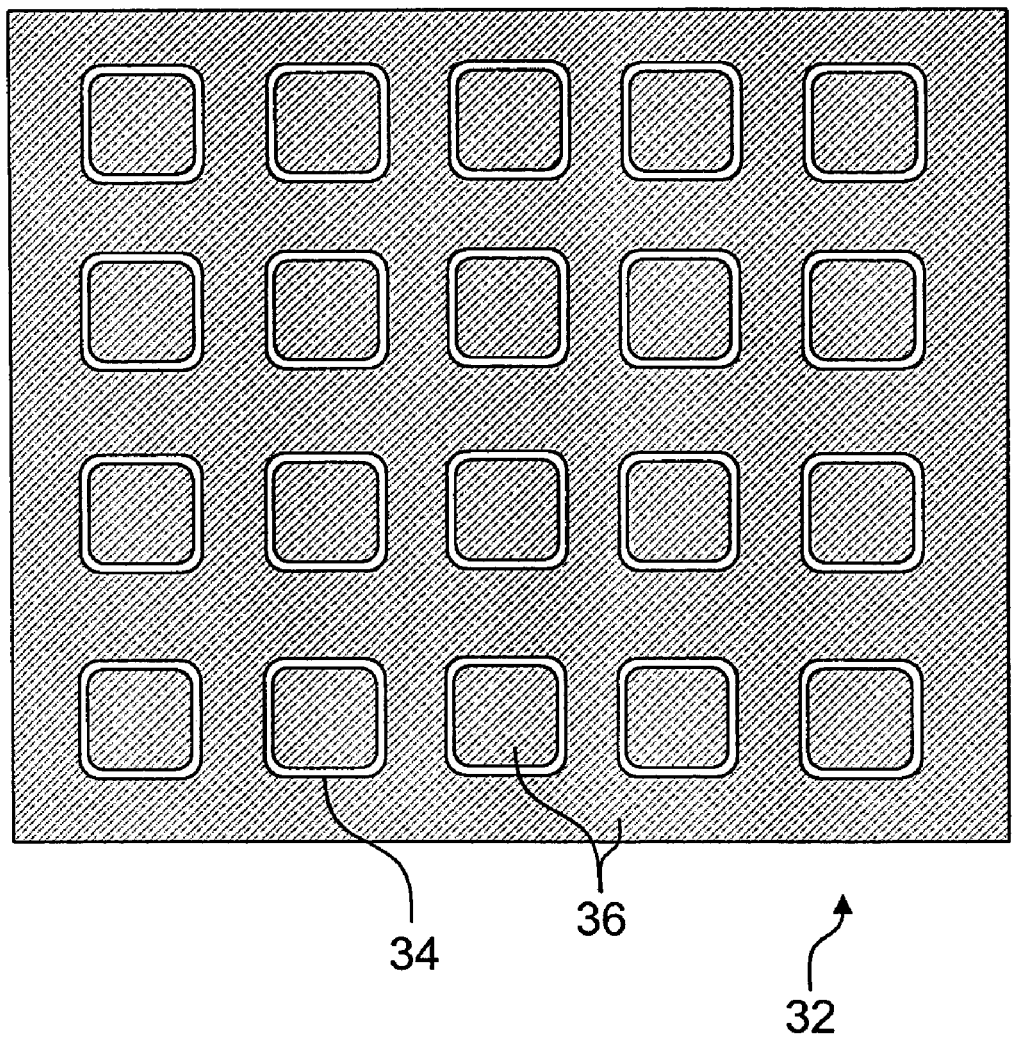
FIG. 6 is a top view of a mask having a plurality of transparent regions for sealing a plurality of OLED display devices.

Mask 32 may be absorbing or reflecting. However, a reflecting mask is preferred, since an absorbing mask may be heated sufficiently by the beam to damage the sensitive OLED element adjacent to the frit. Preferably the diameter of the laser spot impinging on the frit is greater than about 1.8 mm. Mask 32 may be formed, for example, by sputtering a coating overtop a clear glass substrate such that the coated portions of the mask reflect or absorb the light from the laser, and a portion of the impinging beam is transmitted through the uncoated clear glass portion or portions 34 of the mask. Preferably, the transparent portions of the mask coincide with frit 14. For example, if frit 14 is in the shape of an enclosing (encircling) wall or frame, it is desirable that the transparent portion of the mask have a similar shape and dimensions. If a plurality of individual, frame-like frit walls are disposed on a substrate, it is preferred that the mask have a corresponding array of transparent regions 34. Such a mask is depicted in FIG. 6.

Figure 7:
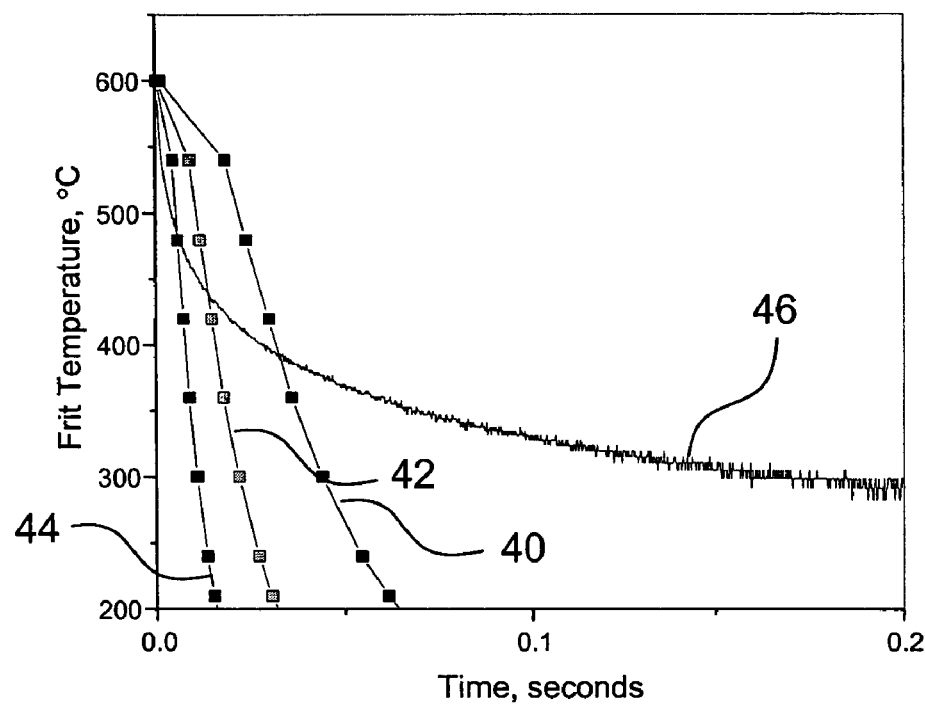
FIG. 7 is a plot of cooling curves (rates) for an OLED display device sealed with a focused laser beam at various traverse speeds of the laser spot over the frit compared with the intrinsic cooling curve.
Figure 8:
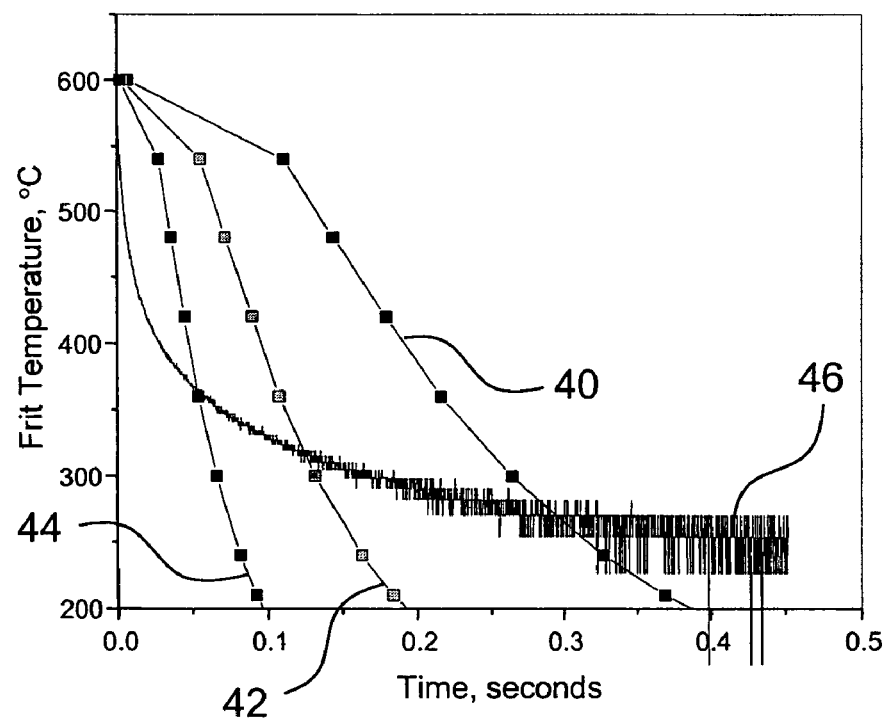
FIG. 8 is a plot of cooling curves (rates) for an OLED display device sealed with a defocused laser beam at various traverse speeds of the laser spot over the frit, compared with the intrinsic cooling curve.
Figure 9:
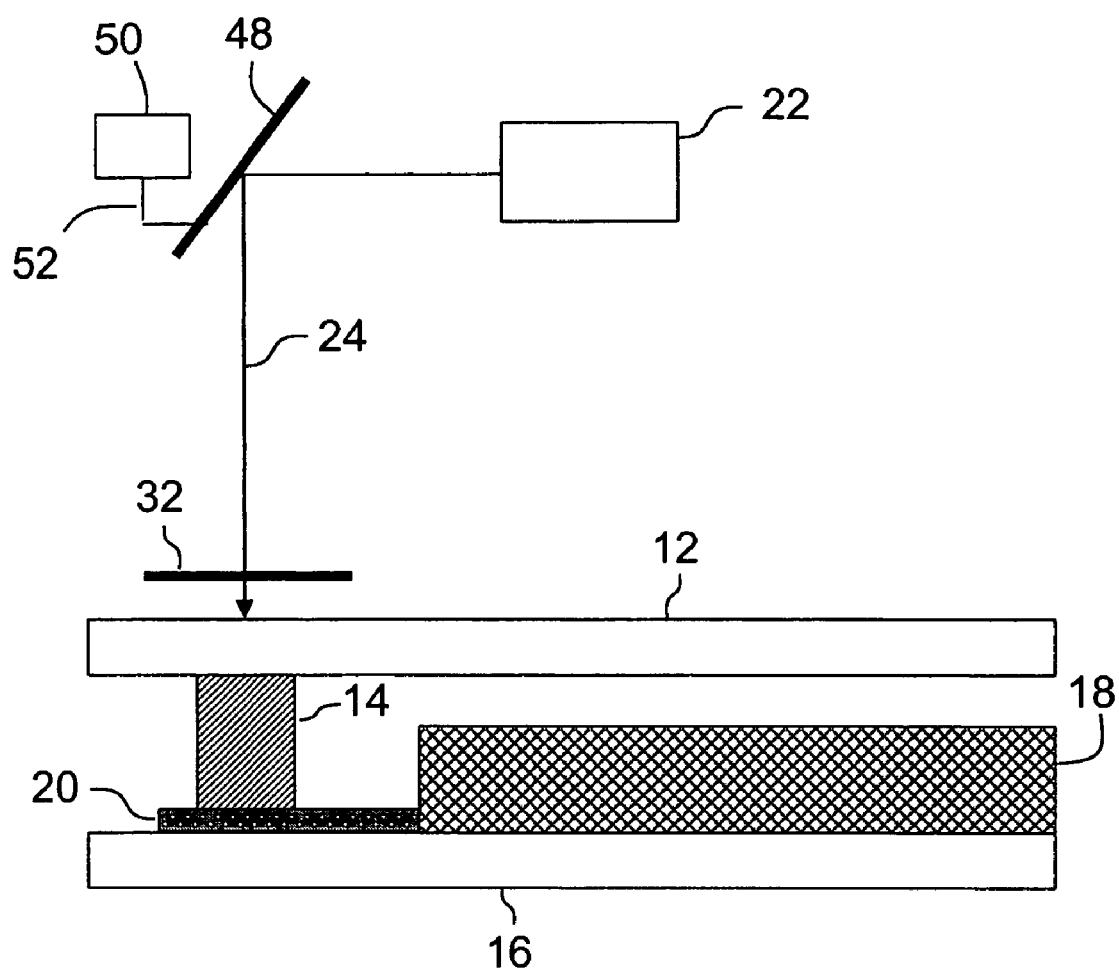
FIG. 9 is a side cross sectional view of a display device having a display element and electrodes deposited thereon, and showing the position of a laser and galvometer controlled laser beam during the sealing operation.

As discussed above, laser beam 24 employed as a sealing beam in accordance with embodiments of the invention may be unfocused, or intentionally defocused. Defocusing the beam such that a beam focus point does not fall on the frit can be used in conjunction with the decreasing intensity distribution in a longitudinal direction (relative to the line of frit) to augment the cooling of the frit and/or substrate. FIG. 7 illustrates the cooling curves for a beam spot having a $1/e^2$ diameter (i.e. $2\omega$) of about 1.8 mm used to seal a frit line having a width of about 1 mm. Curves 40, 42 and 44 show respectively frit temperature as a function of time for 5 mm/s, 10 mm/s and 20 mm/s laser beam traverse speeds, respectively. Also shown is the intrinsic cooling curve 46, which depicts the cooling behavior of the frit/substrate when the frit has been heated and the laser beam quickly extinguished. The laser beam in FIG. 7 is focused on the frit. FIG. 7 may be compared with FIG. 8 which depicts heating of the frit using the same conditions as FIG. 7, but with the laser defocused on the frit. The slower cooling rate is readily observed by comparing a given traverse speed of the laser (e.g. 10 mm/s between the two figures).

In another embodiment, a mask may be attached to or proximate to the laser itself, the beam from the laser passing through the mask. However, because the mask would comprise a slit-like transparent region, this will require a rotation of the mask as the laser traverses a corner of an encircling frame-shaped frit deposited on substrate 12. In either this or the previous embodiment, relative motion between device 10 and laser beam 24 may be accomplished by moving device 10 relative to the laser beam, or moving the laser (and therefore the beam), relative to the device. For example, the laser, or the device, may be mounted to a stage movable in an x-y plane. The stage can be, for example, a linear motor stage whose movement may be computer controlled. Alternatively, both the device and the laser may be stationary, and the beam moved relative to the device by directing beam 24 from the laser to one or more movable reflectors (mirrors) 48, controlled (moved) by galvometers (not shown). The low inertia of galvometer-positioned mirrors, compared to the inertia of the device or laser, provides for rapid traverse speeds for the laser beam over frit 14. A constant spot diameter on the frit as the distance between the frit and the laser varies can be attained by using appropriate lensing techniques (e.g. telecentric lenses), as are known in the art.

It should be emphasized that the above-described embodiments of the present invention, particularly any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A method of encapsulating a display element comprising:
    providing a first substrate and a second substrate separated by at least one frit wall, and at least one display element disposed between the first and second substrates;
    impinging a laser beam on the at least one frit wall through the first substrate;
    traversing the beam along a length of the wall to heat the frit wall and seal the first substrate to the second substrate; and
    wherein an intensity distribution of the impinging beam in a direction of travel of the beam is decreasing as a function of distance from a longitudinal axis of the beam, and an intensity distribution of the impinging beam in a direction orthogonal to the direction of travel varies by no more than about 10% from a peak intensity of the beam.

2. The method according to claim 1 wherein the frit wall comprises a closed frame.

3. The method according to claim 1 wherein the beam has a spot diameter greater than a width $w_f$ of the frit wall.

4. The method according to claim 1 wherein the beam passes through a mask comprising a transparent slit prior to impinging on the frit.

5. The method according to claim 4 wherein the mask is disposed over the first substrate.

6. The method according to claim 4 wherein the mask comprises a reflective surface.

7. The method according to claim 1 wherein the beam is traversed at a speed greater than about 10 mm/s.

8. The method according to claim 1 wherein the beam is traversed at a speed greater than about 30 mm/s.

9. The method according to claim 1 wherein the traversing comprises reflecting the beam from at least one moving reflector.

10. The method according to claim 1 wherein the reflector is moved by a galvonometer.

11. The method according to claim 1 wherein the frit wall has a height between 10 and 30 μm.

12. The method according to claim 1 wherein the mask comprises an absorbing surface.

13. The method according to claim 3 wherein the spot diameter is greater than about 2 times the width $w_f$ of the frit wall.

* * * * *